(12) United States Patent
Ivanov et al.

(10) Patent No.: US 10,516,072 B2
(45) Date of Patent: Dec. 24, 2019

(54) MATERIALS, FABRICATION EQUIPMENT, AND METHODS FOR STABLE, SENSITIVE PHOTODETECTORS AND IMAGE SENSORS MADE THEREFROM

(71) Applicant: InVisage Technologies, Inc., Newark, CA (US)

(72) Inventors: Igor Constantin Ivanov, Danville, CA (US); Edward Hartley Sargent, Toronto (CA); Hui Tian, Cupertino, CA (US)

(73) Assignee: INVISAGE TECHNOLOGIES, INC., Newark, CA (US)

( * ) Notice: Subject to any disclaimer, the term of this patent is extended or adjusted under 35 U.S.C. 154(b) by 0 days.

(21) Appl. No.: 16/008,070

(22) Filed: Jun. 14, 2018

(65) Prior Publication Data

US 2018/0315881 A1  Nov. 1, 2018

Related U.S. Application Data

(63) Continuation of application No. 15/633,276, filed on Jun. 26, 2017, now abandoned, which is a
(Continued)

(51) Int. Cl.
*H01L 29/06* (2006.01)
*H01L 31/101* (2006.01)
(Continued)

(52) U.S. Cl.
CPC ...... *H01L 31/101* (2013.01); *H01L 27/14603* (2013.01); *H01L 31/0224* (2013.01);
(Continued)

(58) Field of Classification Search
CPC .............. H01L 31/101; H01L 31/0224; H01L 31/0324; H01L 31/0336; H01L 31/035218;
(Continued)

(56) References Cited

U.S. PATENT DOCUMENTS 5,399,880 A    3/1995   Chand
5,462,898 A   10/1995   Chen et al.
(Continued)

FOREIGN PATENT DOCUMENTS

WO        2010082955 A1      7/2010

OTHER PUBLICATIONS

U.S. Appl. No. 16/153,858 office action dated Jul. 9, 2019.

*Primary Examiner* — Tu-Tu V Ho
(74) *Attorney, Agent, or Firm* — Kligler & Associates

(57) ABSTRACT

Optically sensitive devices include a device comprising a first contact and a second contact, each having a work function, and an optically sensitive material between the first contact and the second contact. The optically sensitive material comprises a p-type semiconductor, and the optically sensitive material has a work function. Circuitry applies a bias voltage between the first contact and the second contact. The optically sensitive material has an electron lifetime that is greater than the electron transit time from the first contact to the second contact when the bias is applied between the first contact and the second contact. The first contact provides injection of electrons and blocking the extraction of holes. The interface between the first contact and the optically sensitive material provides a surface recombination velocity less than 1 cm/s.

15 Claims, 3 Drawing Sheets

Related U.S. Application Data continuation of application No. 14/961,261, filed on Dec. 7, 2015, now Pat. No. 9,691,931, which is a continuation of application No. 14/336,783, filed on Jul. 21, 2014, now Pat. No. 9,209,331, which is a continuation of application No. 13/473,020, filed on May 16, 2012, now Pat. No. 8,785,908, which is a continuation of application No. 12/506,233, filed on Jul. 20, 2009, now Pat. No. 8,203,195, which is a continuation-in-part of application No. 12/106,256, filed on Apr. 18, 2008, now Pat. No. 7,923,801.

(60) Provisional application No. 61/154,751, filed on Feb. 23, 2009, provisional application No. 61/082,473, filed on Jul. 21, 2008.

(51) Int. Cl.
*H01L 27/146* (2006.01)
*H01L 31/032* (2006.01)
*H01L 31/109* (2006.01)
*H01L 31/0336* (2006.01)
*H01L 31/0352* (2006.01)
*H01L 31/0224* (2006.01)
*H01L 31/0384* (2006.01)
*H01L 31/09* (2006.01)

(52) U.S. Cl.
CPC ........ *H01L 31/032* (2013.01); *H01L 31/0324* (2013.01); *H01L 31/0336* (2013.01); *H01L 31/03845* (2013.01); *H01L 31/035218* (2013.01); *H01L 31/09* (2013.01); *H01L 31/109* (2013.01); *Y02E 10/50* (2013.01)

(58) Field of Classification Search
CPC ......... H01L 31/03529; H01L 31/03845; H01L 31/09; H01L 31/109; H01L 27/14603
USPC .......................................................... 257/21
See application file for complete search history.

(56) References Cited

U.S. PATENT DOCUMENTS

| | | |
|---|---|---|
| 7,358,525 B2 | 4/2008 | Lee |
| 8,803,128 B2 | 8/2014 | Sargent et al. |
| 9,209,331 B2 | 12/2015 | Ivanov et al. |
| 9,257,582 B2 | 2/2016 | Sargent et al. |
| 9,871,160 B2 | 1/2018 | Tian et al. |
| 2004/0118448 A1* | 6/2004 | Scher .................... B82Y 10/00 136/252 |
| 2004/0191563 A1* | 9/2004 | Iwakuma .............. C07C 211/61 428/690 |
| 2005/0186635 A1 | 8/2005 | Bamdad et al. |
| 2005/0205850 A1 | 9/2005 | Whiteford et al. |
| 2006/0163567 A1* | 7/2006 | Park ..................... H01G 9/2031 257/43 |
| 2006/0196537 A1 | 9/2006 | Narkis et al. |
| 2007/0072309 A1 | 3/2007 | Pris et al. |
| 2007/0090753 A1* | 4/2007 | Arakane ................ C09K 11/06 313/504 |
| 2008/0035965 A1 | 2/2008 | Hayashi et al. |
| 2017/0301808 A1 | 10/2017 | Ivanov et al. |
| 2018/0076405 A1 | 3/2018 | Sargent et al. |

* cited by examiner

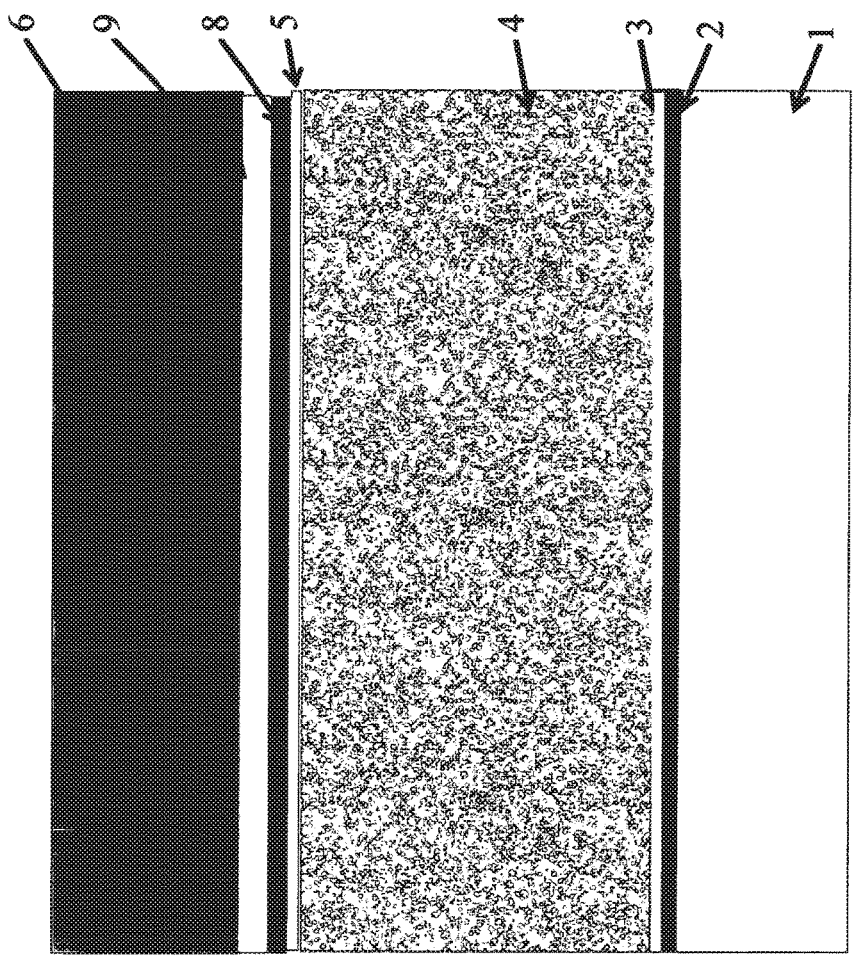

MATERIALS, FABRICATION EQUIPMENT, AND METHODS FOR STABLE, SENSITIVE PHOTODETECTORS AND IMAGE SENSORS MADE THEREFROM

RELATED APPLICATIONS

This application is a continuation of U.S. patent application Ser. No. 15/633,276, filed Jun. 26, 2017, which is a continuation of U.S. patent application Ser. No. 14/961,261, filed Dec. 7, 2015, now issued as U.S. Pat. No. 9,691,931, which is a continuation of U.S. patent application Ser. No. 14/336,783, filed Jul. 21, 2014, now issued as U.S. Pat. No. 9,209,331, which is a continuation of U.S. patent application Ser. No. 13/473,020, filed May 16, 2012, now issued as U.S. Pat. No. 8,785,908, which is a continuation patent application of U.S. patent application Ser. No. 12/506,233, filed Jul. 20, 2009, now issued as U.S. Pat. No. 8,203,195, which is a continuation-in-part patent application of U.S. patent application Ser. No. 12/106,256, filed Apr. 18, 2008, now issued as U.S. Pat. No. 7,923,801, which claims the benefit of priority under 35 U.S.C. § 119(e) to U.S. Patent Application No. 61/082,473, filed Jul. 21, 2008. U.S. Pat. No. 8,203,195 also claims the benefit of priority under 35 U.S.C. § 119(e) to U.S. Patent Application No. 61/154,751, filed Feb. 23, 2009, all of which are incorporated herein by reference in their entireties.

TECHNICAL FIELD

The present invention generally relates to optical and electronic devices, systems and methods that include optically sensitive material, such as nanocrystals or other optically sensitive material, and methods of making and using the devices and systems.

BACKGROUND

Optoelectronic devices, such as image sensors and photovoltaic devices, can include optically sensitive material. Example image sensors include devices that use silicon both for the sensing function and for the read-out electronics and multiplexing functions. In some image sensors, optically sensitive silicon photodiodes and electronics can be formed on a single silicon wafer. Other example image sensors can employ a distinct material, such as InGaAs (for short-wave IR sensing), or amorphous selenium (for x-ray sensing), for the sensing (photon to electron conversion) function. Example photovoltaic devices include solar cells that use crystalline silicon wafers for photon to electron conversion. Other example photovoltaic devices can use a separate layer of material such as amorphous silicon or polycrystalline silicon or a distinct material for photon to electron conversion. However, these image sensors and photovoltaic devices have been known to have a number of limitations.

INCORPORATION BY REFERENCE

Each patent, patent application, and/or publication mentioned in this specification is herein incorporated by reference in its entirety to the same extent as if each individual patent, patent application, and/or publication was specifically and individually indicated to be incorporated by reference.

BRIEF DESCRIPTION OF THE DRAWINGS

FIG. 3 shows a cross-section of the materials stack over a pixel, under an embodiment.

DETAILED DESCRIPTION

Figure 1:
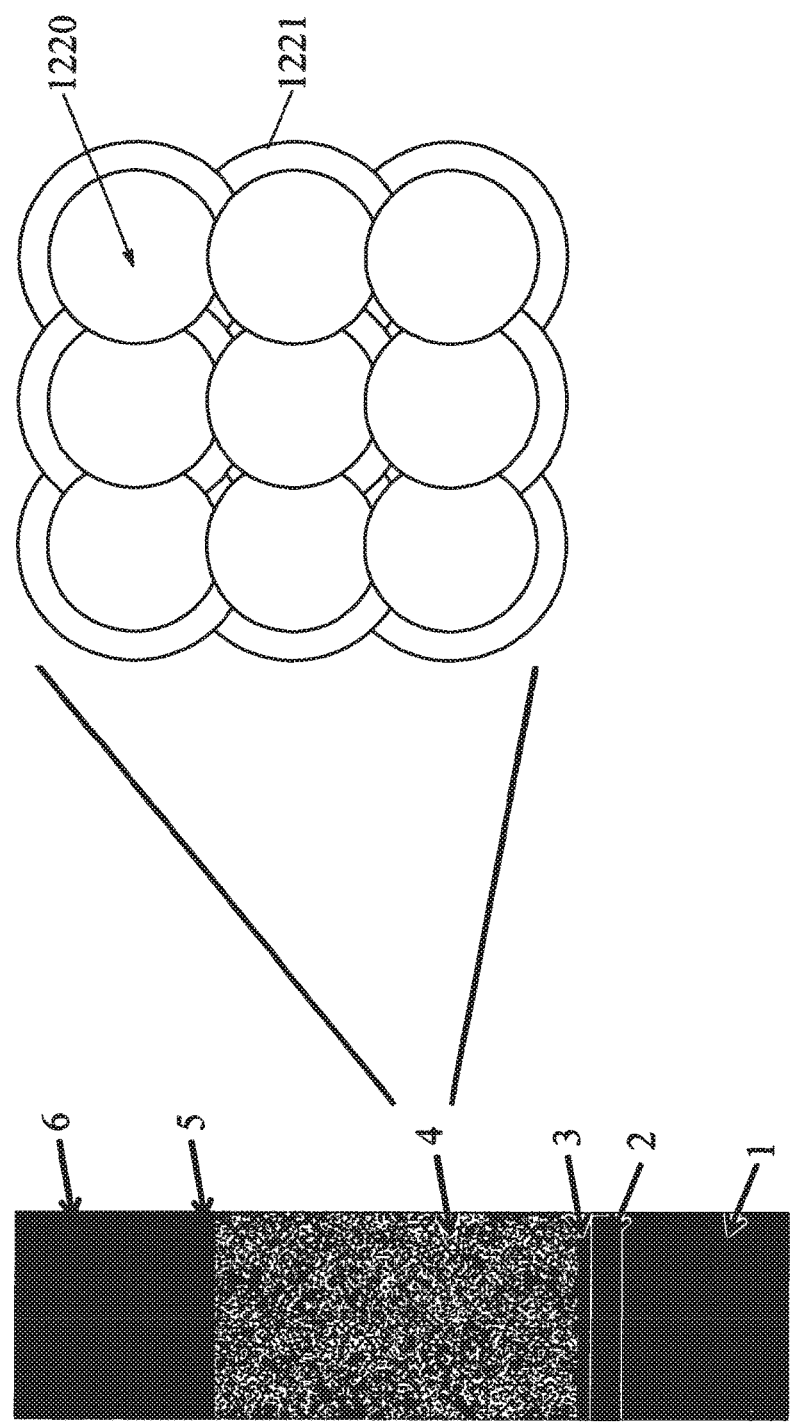
FIG. 1 shows a materials stack, under an embodiment.

An optically sensitive device is described below. The device comprises a first contact and a second contact, each having a work function, and an optically sensitive material between the first contact and the second contact. The optically sensitive material comprises a p-type semiconductor, and the optically sensitive material has a work function. The device comprises circuitry that applies a bias voltage between the first contact and the second contact. The magnitude of the work function of the optically sensitive material is at least 0.4 eV greater than the magnitude of the work function of the first contact, and also at least 0.4 eV greater than the magnitude of the work function of the second contact. The optically sensitive material has an electron lifetime that is greater than the electron transit time from the first contact to the second contact when the bias is applied between the first contact and the second contact. The first contact provides injection of electrons and blocking the extraction of holes. The interface between the first contact and the optically sensitive material provides a surface recombination velocity less than 1 cm/s.

An optically sensitive device is described below. The device comprises a first contact, an n-type semiconductor, an optically sensitive material comprising a p-type semiconductor, and a second contact. The optically sensitive material and the second contact each have a work function shallower than 4.5 eV. The device comprises circuitry that applies a bias voltage between the first contact and the second contact. The optically sensitive material has an electron lifetime that is greater than the electron transit time from the first contact to the second contact when the bias is applied between the first contact and the second contact. The first contact provides injection of electrons and blocks the extraction of holes. The interface between the first contact and the optically sensitive material provides a surface recombination velocity less than 1 cm/s.

A photodetector is described below. The photodetector comprises a first contact and a second contact, each having a work function. The photodetector comprises an optically sensitive material between the first contact and the second contact, the optically sensitive material comprising a p-type semiconductor, and the optically sensitive material having a work function. The photodetector comprises circuitry that applies a bias voltage between the first contact and the second contact. The magnitude of the work function of the optically sensitive material is at least 0.4 eV greater than the magnitude of the work function of the first contact, and also at least 0.4 eV greater than the magnitude of the work function of the second contact. The photodetector comprises circuitry that applies a bias voltage between the first contact and the second contact. The optically sensitive material provides a responsivity of at least 0.8 A/W when the bias is applied between the first contact and the second contact.

In the following description, numerous specific details are introduced to provide a thorough understanding of, and enabling description for, embodiments of the systems and methods. One skilled in the relevant art, however, will recognize that these embodiments can be practiced without one or more of the specific details, or with other components, systems, etc. In other instances, well-known structures or operations are not shown, or are not described in detail, to avoid obscuring aspects of the disclosed embodiments.

Image sensors incorporate arrays of photodetectors. These photodetectors sense light, converting it from an optical to an electronic signal. Following is a description of numerous features, any one or a combination of which can be found in the photodetectors of an embodiment; the embodiments herein are not, however, limited to only these features.

The photodetectors of an embodiment are readily integrable with other circuitry related to the image sensing function, such as circuits which store charge, circuits which relay signal levels to the periphery of the array, circuits which manipulate these signal levels in the analog domain, circuits which convert analog into digital signals, and circuits which process image-related data in the digital domain.

The photodetectors of an embodiment provide a maximum of sensitivity to light within the wavelength band, or bands, of interest, along with low dark current. Sensitivity is often quantified using the measure signal-to-noise ratio (SNR) at a given level of illumination. Signal is maximized when the responsivity, quantum efficiency, or gain of the device is maximized. Noise is minimized when random fluctuations in electronic signals are minimized, subject to the limits prescribed by natural fluctuations in electrical currents and voltages at a given temperature. Relatedly, noise and other uncontrolled or difficult-to-predict variations in background signal are generally minimized when the magnitude of dark current is minimized.

The photodetectors of an embodiment provide a response time that is relatively fast when compared to conventional photodetectors formed using conventional processing methods. Applications such as video imaging and shutterless still-image acquisition typically require photodetectors whose signal levels change substantially completely in response to a transient within fewer than 100 milliseconds (10 frames per second), or fewer than 33 miliseconds (30 frames per second), or even 1 millisecond ($\frac{1}{1000}$ second exposure of a still image).

The photodetectors of an embodiment provide for the detection of a wide range of light intensities in a manner that can conveniently be processed by conventional electronic circuitry. This feature is known as providing high dynamic range. One method of providing high dynamic range is to compress the measured electronic response as a function of the incident optical stimulus. Such compression can be referred to as a sublinear, i.e. a nonlinear with decreasing slope, dependence of electrical signal on incident intensity. High dynamic range can also be facilitated by employing a photodetector whose gain can be controlled, such as through the selection of a voltage bias known to produce a specific gain.

The photodetectors of an embodiment can provide for the discrimination among different spectral bands of electromagnetic radiation. Of particular interest are the x-ray, ultraviolet, visible (including blue, green, and red), near-infrared, and short-wavelength infrared bands.

A description follows of methods and processes for creating, integrating (e.g., with circuits), and exploiting in a variety of applications top-surface photodetectors or arrays of photodetectors.

The photodetectors, and arrays of photodetectors, described herein can readily be integrated with other portions of image sensor circuits and systems by methods such as spin-coating, spray-coating, drop-coating, sputtering, physical vapor deposition, chemical vapor deposition, and self-assembly, to name a few. Embodiments include exchanging ligands passivating nanoparticle surfaces for shorter ligands that will provide for appropriate charge carrier mobilities once films are formed. Embodiments include solution-phase exchanges which enable the realization of smooth-morphology films necessary to the realization of image sensors having acceptable consistent dark currents and photoresponses across an array.

The photodetectors described herein provide relatively maximum sensitivity. They maximize signal by providing photoconductive gain. Values for photoconductive gain range from 1-50, resulting in responsivities in, for example, the visible wavelengths ranging from 0.4 A/W to 20 A/W. In embodiments, the photodetectors described herein minimize noise by fusing nanocrystal cores such as to ensure substantially non-noise-degrading electrical communication among the particles making up the optically sensitive layer through which current flows. In embodiments, the photodetectors described herein minimize dark current by minimizing the net doping of the active layer, thus ensuring that the dark carrier density, and thus the dark conductance, of these optically sensitive materials is minimized. In embodiments, the photodetectors described herein minimize dark current by providing an electrode-to-nanocrystalline-layer electrical connection that blocks for example one type of carrier, including potentially the majority carrier at equilibrium. In embodiments, cross-linking molecules are employed that utilize chemical functionalities that remove oxides, sulfates, and/or hydroxides responsible for p-type doping. Thus, in embodiments, a more intrinsic or even n-type optically sensitive layer can be provided, leading to lowered dark currents. In embodiments, many steps in quantum dot synthesis and/or processing and/or device packaging can be performed in a controlled environment such as a Schlenk line or Glove Box; and optically sensitive layers can be encapsulated using substantially impermeable layers such as oxides, oxynitrides, or polymers such as polyxylylene, or epoxies, in order to prevent reactive gases such as oxygen or water from significantly permeating the optically sensitive layer. In this manner, combinations of properties such as gain, dark current, and lag can be preserved over the useful lifetime of an image sensor.

The photodetectors described herein provide a time-domain response that can be as rapid as approximately sub-100-miliseconds, sub-30-milliseconds, and sub-1-millisecond. In embodiments, this is achieved by providing gain-providing (and persistence-providing) trap states associated with the optically sensitive layer that trap at least one type of carrier for only a limited time period such as 100 milliseconds, 30 milliseconds, or sub-1 millisecond. In embodiments, PbS nanoparticles are decorated with $PbSO_3$, an oxide of PbS, which is shown to have a trap state lifetime in the vicinity of approximately 20-30 milliseconds, providing for a transient response suited to many video imaging applications. In embodiments, photodiodes are instead provided based on colloidal quantum dot layers, wherein two electrical contacts having appreciably different work functions are employed to contact the active layer. In embodiments, dark currents can be minimized through operation of such devices without the application of an appreciable external voltage bias. In embodiments, cross-linking moieties such as benzenedithiol, a bidentate linker, can be employed to remove and/or passivate certain trap states that can be present, or can develop, in such materials.

The photodetectors described herein provide enhanced dynamic range by producing a sublinear dependence of electrical signal (such as photocurrent). Over a region of low to middling intensities, trap states are available to become filled, and escape occurs following some moderate persistence, or trap state, lifetime, such as 30 milliseconds for example. At higher intensities, these trap states become substantially filled, such that charge carriers experience shorter lifetimes, or persistence times, corresponding to lower differential gains. As a result these devices exhibit substantially constant gains over a range of low to middling intensities, followed by a gentle roll-off in gain at higher intensities. Put another way, at low to middling intensities, photocurrent depends approximately linearly on intensity, but at higher intensities, photo current exhibits sub linear dependence on intensity. In embodiments, photodetectors are provided wherein photoconductive gain depends on the bias applied to a device. This arises because gain is proportional to carrier lifetime divided by carrier transit time, and transit time varies in inverse proportionality with applied field. In embodiments, circuits are developed that exploit this dependence of gain on bias to increase dynamic range.

In embodiments, photodetectors described herein are readily altered, or 'tuned', to provide sensitivity to different spectral bands. Tuning is provided herein through the quantum size effect, whereby nanoparticle diameter is decreased, in cases through synthetic control, to increase the effective bandgap of the resulting quantum dots. Another method of tuning is provided through the choice of materials composition, wherein the use of a material having a larger bulk bandgap generally facilitates the realization of a photodetector with responsivity onset at a relatively higher photon energy. In embodiments, photodetectors having different absorption onsets can be superimposed to form vertical pixels, wherein pixel(s) closer to the source of optical signal absorb and sense higher-energy bands of electromagnetic radiation, whereas pixel(s) further from the source of optical signal absorb and sense lower-energy bands.

FIG. 1 shows a materials stack, under an embodiment. The materials stack is integrated with complementary metal-oxide-semiconductor (CMOS) silicon circuitry, but is not so limited. The use of CMOS silicon circuitry to read the signals transduced by photoconductive photodetectors, including top-surface photodetectors, and including those based on colloidal quantum dots including PbS, includes the integration of top-surface photoconductive materials with silicon CMOS electronics. The structure and composition of the photoconductive photodetector is described in detail below.

Figure 2:
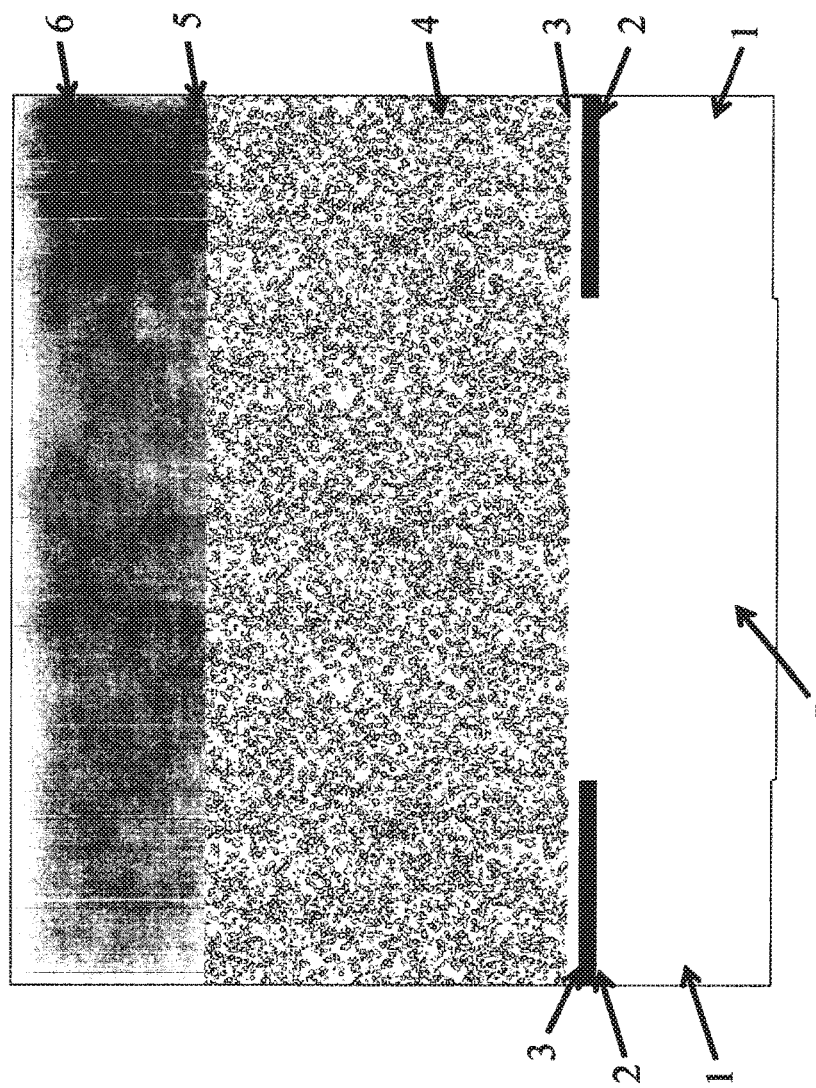
FIG. 2 shows a cross-section of the materials stack over a portion of a pixel, under an embodiment.

FIG. 2 shows a cross-section of the materials stack over a portion of a pixel, under an embodiment. The figure depicts, in the left and right hand sides or regions, the same materials stack referenced in FIG. 1. In the lateral middle of the device is incorporated a discontinuity in the material metal '1' which is replaced by material '7.' Material '7' can in general be an insulator such as SiO2 or SiOxNy. Embodiments of FIG. 2 can be referred as a portion of a lateral pixel. In embodiments, current substantially flows between metals '1' through material '2' (interface), material '3' (adhesion), and material '4' (photosensitive layer). Different portions or regions of the materials stack described herein are referred to herein as "materials" or "layers" but are not so limited.

FIG. 3 shows a cross-section of the materials stack over a pixel, under an embodiment. Embodiments of FIG. 3 can be referred to as a portion of a vertical pixel. The figure depicts with materials '1' '2' '3' '4' '5' '6' generally the same materials stack as described above with reference to FIG. 1. An interface material or layer '8' is incorporated or integrated on a top portion or region of the device. Material '8' comprises a member or members of the sets of materials described herein as material '2'. A metal or contact layer or material '9' is incorporated or integrated on a top portion or region of the device. The metal or contact layer '9' comprises a member or members of the sets of materials described herein as material '1'. In embodiments, material '9' comprises a transparent conductive material such as indium tin oxide, tin oxide, or a thin (substantially nonabsorbing to visible light) metal such as TiN, Al, TaN, or other metals recited below under material '1.'

Material "1" is a metal that lies above the substrate (not shown) and can be a silicon CMOS integrated circuit. During processing it can be a 200 mm or 300 mm wafer, i.e. a wafer that has not yet been singulated to form die. Material "1" refers to a metal, present at the top surface of the CMOS integrated circuit wafer, which is presented and available for physical, chemical, and electrical connection with subsequent layers. The metal can include: TiN, TiO2, TixNy, Al, Au, Pt, Ni, Pd, ITO, Cu, Ru, TiSi, WSi2, and combinations thereof. Material "1" is referred to as the contact, or the electrode, although it shall be discussed herein that the behavior of this contact is influenced by thin layers that can reside between the metal and material "4", the photoconductive quantum dot layer.

The metal can be chosen to achieve a particular work function, and can influence whether an ohmic or non-ohmic (e.g. Schottky) contact is formed with respect to the layers to which it is proximate. For example, the metal can be chosen to provide a shallow work function, such as a value generally between −2.0 eV and −4.5 eV, for example values lying between −2.0 eV and −4.2 eV.

The metal can achieve a surface roughness less than 5 nm root-mean-squared.

The metal can be patterned with a critical dimension of 0.18 micrometers or smaller. The metal can be patterned such that, pixel-to-pixel, the spacing of the electrodes (such as between a pixel center electrode and a grid) does not vary by more than a standard deviation of 1%.

The metal can be terminated with an oxide such as a native oxide—such as TiOxNy in the case of TiN. In general this oxide, or other materials atop it such as organic residues, inorganic residues such as 'polymer,' etc. are of a consistent and known composition thickness.

The metal can be a conductive material, where the bulk of the material constituting the metal can have a resistivity that is less than 100 microOhm*cm.

The metal can be processed such that, across the wafer, in all regions where light-sensing pixels are to be formed, it is not capped with any additional oxides or organics or contaminants.

The top surface of the wafer, prior to or after the formation of the interface layer, can comprise regions of metal and insulating material (such as an insulating oxide), such that the peak-to-valley distance of features on this surface is less than 50 nm.

Prior to the introduction of the photosensitive semiconductor layer, the leakage current flowing between a pixel electrode in the center of a 1.1×1.1 um or 1.4×1.4 um square grid electrode should be less than 0.1 fA at 3 V bias.

Layers or materials above material '1' form an interface, or interface layer. Each of the layers forming the interface is described in detail below, in turn.

Material "2" is the first part or portion of the interface layer, and comprises a material that resides atop the metal. Material '2' can comprise a pure, clean surface of the metal. The material of this layer can include oxides, including those generally formed, either through exposure to water, oxygen, or other oxidizing species, as a result of the presence of the exposed metal; or it can be deliberately formed such as through exposure to a controlled oxidizing environment and exposures to elevated temperatures, such as in rapid thermal processing. Native oxides include, for example, the following: TiO2 and TiOxNy atop TiN; Al2O3 atop Al; Au2O3 atop Au; PtO or PtO2 on Pt; Ni2O3 atop Ni; WO3 atop W; PdO atop Pd; and oxygen-rich ITO atop ITO. It can be that such a native oxide is to be removed, such as using etching, and replaced with another layer. For example, a native oxide such as TiOxNy can be etched (using a process such as argon sputtering) and then a layer can be deposited on top of it such as a controlled oxide such as TiO2, TiOx, or TiOxNy. The sum of the 3es of native oxides and deliberately-deposited oxides can be between 2 and 20 nm.

A portion of material '2' can be a material that is substantially transparent to most or all wavelengths of visible light. It can have a bandgap that is larger than 2 eV or larger than 2.5 eV or larger than 3 eV. It can be a large-bandgap doped semiconductor. It can achieve doping through stoichiometry, such as in the case of TiOx where x is varied below or above material 2 in order to achieve net doping. Values of x can be typically 1.9 to achieve an excess of Ti over stoichiometric TiO2. Values of x can typically be 2.1 to achieve an excess of O over stoichiometric TiOx. TiOx where x<~2 can be achieved by exposing stoichiometric TiO2 to a reducing environment. The density of free electrons can be increased, corresponding to greater n-type doping, by increase the extent to which initially stoichiometric TiO2 is reduced, i.e. by decreasing x in TiOx more considerably relative to the value 2. TiO2 can be doped with nitrogen in order to modify its free carrier concentration, work function, and electron affinity. TiO2 or TiOx can be doped with B, C, Co, Fe. It can be a mildly n-type material such as lightly doped TiOx having an equilibrium carrier density of 10^10 cm-3. It can be a moderately doped n-type material such as TiOx having an equilibrium carrier density of 10^16 cm-3. It can be a more strongly doped n-type material such as TiOx having an equilibrium carrier density of 10^18 or 10^19 cm-3. Its electron affinity can correspond energetically substantially closely with the work function of the metal. Its work function can correspond substantially closely with the work function of the metal. Its ionization potential can reside at an energy that is much deeper than the ionization potential of the optically-absorbing layer (material '4' described herein). It can be terminated through annealing processes, gas-phase treatments, or chemical treatments such as exposure to organic molecules, such as to achieve a low surface recombination velocity for holes when in contact with an adjacent semiconductor layer such as the optically-absorbing layer ('4' discussed below).

Material '3' can also be present in the interface layer, and comprises a material that can be positioned or reside atop the first portion of the interface layer. Material '3' includes adsorbed organics such as organic molecules, introduced deliberate or accidentally or through some combination thereof, that reside above the metal, either in direct contact with the metal, or in direct contact with the metal oxide. These molecules are discussed in detail herein.

Embodiments include material '2' while material '3' is absent. Such embodiments include choices of materials in which no adhesion layer such as that provided by material '3' is required. As an example, if material '2' incorporates a metal such as titanium, such as if material '2' incorporates TiOx, and if material '4' incorporates a crosslinker such as mercaptobenzoic acid, in which one functional group on the mercaptobenzoic acid binds the TiOx, then adhesion between material '4' and material '2' can be provided without explicit inclusion of material '3'.

In embodiments, all of material '1' material '2' and material '3' can be present. Embodiments included cases where a Schottky contact is made via the metal '1' to the material '4' without the deliberate introduction of a heterojunction. Embodiments included a device in which TiN or TiOxNy forms the metal '1', layer '2' is a clean termination of the metal '1,' with no significant formation of a native oxide, an adhesion layer such as hexamethyldisilazane is provided in material '3'.

In embodiments, all of material '1' material '2' and material '3' can be present. Embodiments include cases where a heterojunction is formed via the use of a large-bandgap oxide in material '2' to the photosensitive layer '4.' Embodiments include a device in which TiN or TiOxNy forms the metal '1,' layer '2' includes a large-bandgap semiconductor such as TiOx (which can be structurally doped, impurity doped, both, or neither), and an adhesion layer such as hexamethyldisilazane can be provided in material '3'

In embodiments, material '1' can be aluminum metal, material '2' can include a native oxide of aluminum and can include a doped conductive oxide such as doped Al2O3 and/or can include a large-bandgap semiconductor such as TiOx (which can be structurally doped, impurity doped, both, or neither), and material '3' can include an adhesion layer such as hexamethyldisilazane can be provided in material '3'.

In embodiments, material '1' can include aluminum, gallium, indium, tin, lead, bismuth, magnesium, calcium, zinc, molybdenum, titanium, vanadium, lanthanum, chromium, manganese, iron, cobalt, nickel, copper, zirconium, niobium, palladium, silver, hafnium, tantalum, tungsten, iridium, platinum, gold. In embodiments, metals used in standard CMOS such as aluminum, tungsten, tantalum, titanium, copper can be preferred.

In embodiments, material '2' can include a surface of the metal and can include oxides, nitrides, or oxynitrides of aluminum, gallium, indium, tin, lead, bismuth, magnesium, calcium, zinc, molybdenum, titanium, vanadium, lanthanum, chromium, manganese, iron, cobalt, nickel, copper, zirconium, niobium, palladium, silver, hafnium, tantalum, tungsten, iridium, platinum, gold. In embodiments, it can be preferred that it include oxides, nitrides, or oxynitrides of metals used in standard CMOS such as aluminum, tungsten, tantalum, titanium, copper.

In embodiments, material '2' can comprise multiple sublayers. In embodiments, it can comprise a sublayer consisting of a metal such as aluminum, gallium, indium, tin, lead, bismuth, magnesium, calcium, zinc, molybdenum, titanium, vanadium, lanthanum, chromium, manganese, iron, cobalt, nickel, copper, zirconium, niobium, palladium, silver, hafnium, tantalum, tungsten, iridium, platinum, gold. In embodiments, it can be preferred that this sublayer can comprise metals used in standard CMOS such as aluminum, tungsten, tantalum, titanium, copper. In embodiments, material '2' can comprise a further sublayer consisting of oxides, nitrides, or oxynitrides of aluminum, gallium, indium, tin, lead, bismuth, magnesium, calcium, zinc, molybdenum, titanium, vanadium, lanthanum, chromium, manganese, iron, cobalt, nickel, copper, zirconium, niobium, palladium, silver, hafnium, tantalum, tungsten, iridium, platinum, gold. In embodiments, it can be preferred that this further sublayer include oxides, nitrides, or oxynitrides of metals used in standard CMOS such as aluminum, tungsten, tantalum, titanium, copper.

The layer referred to as material '4' refers to an optically-absorbing layer that includes nanocrystals, or quantum dots.

A quantum dot (QD), depicted in '1220' in FIG. 1, can be a nanostructure, for example a semiconductor nanostructure, that confines a conduction band electrons, valence band holes, or excitons (bound pairs of conduction band electrons and valence band holes) in all three spatial directions. The confinement can be due to electrostatic potentials (e.g., generated by external electrodes, doping, strain, impurities), the presence of an interface between different semiconductor materials (e.g., in core-shell nanocrystal systems, incorporated in '1221' of FIG. 1) or a semiconductor and another material (e.g., a semiconductor decorated by organic ligands; or by a dielectric such as an oxide such as PbO, a sulfite such as $PbSO_3$, a sulfate such as $PbSO_4$, or $SiO_2$ incorporated in '1221' of FIG. 1), the presence of a semiconductor surface incorporated in '1221' of FIG. 1, or a combination of one or more of these. A quantum dot exhibits in its absorption spectrum the effects of the discrete quantized energy spectrum of an idealized zero-dimensional system. The wave functions that correspond to this discrete energy spectrum are substantially spatially localized within the quantum dot, but extend over many periods of the crystal lattice of the material. In one example embodiment, the QD can have a core of a semiconductor or compound semiconductor material, such as PbS. Ligands can be attached to some or all of the outer surface or can be removed in some embodiments. In some embodiments, the cores of adjacent QDs can be fused together to form a continuous film of nanocrystal material with nanoscale features. In other embodiments, cores can be connected to one another by linker molecules. In some embodiments, trap states can be formed on the outer surface of the nanocrystal material. In some example embodiments, the core can be PbS and trap states can be formed by an oxide such as $PbSO_3$ formed on the outer surface of core.

A QD layer can include a continuous network of fused QD cores, having outer surfaces that are of a different composition than that in the core, e.g., oxidized core material such as $PbSO_3$, or a different kind of semiconductor. The individual QD cores in the film are in intimate contact, but continue to exhibit many of the properties of individual quantum dots. For example, a lone (unfused) quantum dot has a well-characterized excitonic absorbance wavelength peak that arises from quantum effects related to its size, e.g., 1-10 nm. The excitonic absorbance wavelength peak of the fused QDs in the film is not significantly shifted from the central absorbance wavelength that was present prior to fusing. For example, the central absorbance wavelength can change by about 10% or less when fused. Thus, the QDs in the film retain their quantum effects, despite the fact that they can be an integral part of a macroscopic structure. In some embodiments, QD cores are linked by linker molecules as described further below. This allows current to flow more readily than through unlinked, unfused QDs. However, the use of linker molecules to form a continuous film of QDs instead of fusing the cores can reduce the dark current for some photo conductor and image sensor embodiments.

In some embodiments the QD layer is exceptionally radiation sensitive. This sensitivity is particularly useful for low-radiation imaging applications. At the same time, the gain of the device can be dynamically adjusted so that the QDPC saturates, that is, additional photons continue to provide additional useful information that can be discerned by the readout electronic circuit. Tuning of gain can be conveniently achieved by changing the voltage bias, and thus the resultant electric field, across a given device, e.g., a pixel. Some embodiments of QD devices include a QD layer and a custom-designed or pre-fabricated electronic read-out integrated circuit. The QD layer is then formed directly onto the custom-designed or pre-fabricated electronic read-out integrated circuit. The QD layer can additionally be patterned so that it forms individual islands. In some embodiments, wherever the QD layer overlies the circuit, it continuously overlaps and contacts at least some of the features of the circuit. In some embodiments, if the QD layer overlies three-dimensional features of the circuit, the QD layer can conform to these features. In other words, there exists a substantially contiguous interface between the QD layer and the underlying electronic read-out integrated circuit. One or more electrodes in the circuit contact the QD layer and are capable of relaying information about the QD layer, e.g., an electronic signal related to the amount of radiation on the QD layer, to a readout circuit. The QD layer can be provided in a continuous manner to cover the entire underlying circuit, such as a readout circuit, or patterned. If the QD layer is provided in a continuous manner, the fill factor can approach about 100%, with patterning, the fill factor is reduced, but can still be much greater than a typical 35% for some example CMOS sensors that use silicon photodiodes. In many embodiments, the QD optical devices are readily fabricated using techniques available in a facility normally used to make conventional CMOS devices. For example, a layer of QDs can be solution-coated onto a pre-fabricated electronic read-out circuit using, e.g., spin-coating, which is a standard CMOS process, and optionally further processed with other CMOS compatible techniques to provide the final QD layer for use in the device. Because the QD layer need not require exotic or difficult techniques to fabricate, but can instead be made using standard CMOS processes, the QD optical devices can be made in high volumes, and with no significant increase in capital cost (other than materials) over current CMOS process steps.

The QD material can have an absorption cutoff approximately at the edge of the visible, such as round 650 nm. The QD material can have an absorption cutoff at longer wavelengths, in order to ensure a high absorbance over the entire visible, such as when the absorption cutoff is in the 700-900 nm range.

The QD film can be deposited using conventional spin-on process, ink-jet printing process, Langmuir-Blodgett film deposition, electrokinetic sprays, or nano-imprint. The QD film can be deposited using dispensing of QD solution on a wafer at 30 RPM followed by three-step spin process.

The spectral position of the peak in the QD solution absorption can be specified to lie at 740 nm, +/−10 nm. The ratio of the absorbance at the QD absorption peak near 740 nm, and the valley slightly to the blue of this peak, can be specified to be 1.2.

The thickness of the quantum dot layer can be specified to be 300 nm+/−50 nm. The thickness of the quantum dot layer can be chosen to ensure that, over the spectral range 400-640 nm, greater than 90% of all light incident on the film is absorbed. The roughness (root-mean-squared) of the quantum dot film can be specified to be less than 5 nm.

The dark current in a 1.1×1.1 um pixel can be less than 0.5 fA under suitable bias, such as a 3V bias. The gain can be greater than 10 in a 1.1×1.1 um pixel.

Alkali metal impurities can be present at lower than 5E17 cm-3 concentration in the quantum dot film. Defects greater than 0.16 microns in size can be fewer than 20 across a 200 mm wafer. The mobility of the flowing carrier can exceed 1E-5 cm2/Vs. The loading fraction of nanocrystals in the film can exceed 30% by volume.

Incorporated into material '4' can be chemical species such as PbO, PbSO4, PbSO3, poly-sulfates; and they can also include physically-adsorbed species such as O2, N2, Ar, H2, CO2, H2O, and H2S.

Incorporated into material '4' can be molecules that are bound to the surface of at least one nanoparticle, or nanocrystal, or quantum dot. These can include thiol-terminated ligands such as benzenethiol, ethanethiol; carboxylate-terminated molecules such as oleic acid and formic acid; amine-terminated ligands such as pyridine, butylamine, octylamine. They can also include bidentate cross linkers such as benzenedithiol, ethanedithiol, and butanedithiol. They can also include multidentate molecules that include (1) a backbone (2) certain sidegroups and/or endgroups that bind to the nanoparticle surface, including thiols, amines, carboxylates; and (3) other functional groups such as those that confer solubility in polar, nonpolar, and partially polar solvents.

Material '5' can include layers on top of '4' that can provide passivation of the underlying material, including minimizing the extent of movement of species between layers '1'-'4' of the materials stack and the outside of the materials stack. This layer can also facilitate good physical adhesion with overlying layers such as encapsulant layers.

Material '6' refers to a layer, or layers, that can be included on top of the material stack and can serve to minimize the extent of movement of species between layers '1'-'4' of the materials stack and the outside of the materials stack. In a planar cell configuration the quantum dot film layer can be encapsulated against oxygen and moisture diffusion using a low-temperature (less than 100° C.) PECVD SiO2, SiN, or SiOCN process providing optically transparent film suitable for further integration with CFA. The film can be specified to have a thickness of 200 nm+/−10 nm. It can be specified to have a surface roughness less than 5 nm rms. Optical transmittance can exceed 99%. Adhesion can be provided to the underlying layers. An embodiment can have fewer than twenty greater-than 0.1-um particle defects across a 200 mm wafer. An embodiment can have fewer than twenty greater-than 0.1-um pinholes across a 200 mm wafer.

The nature of the interface between the electrical contact and the light-sensitive semiconductor is an important determinant of device stability and performance. For example, whether the contact is ohmic vs. Schottky, and whether the contact and semiconductor are separated by a thin interfacial layer which passivates at least one of the {semiconductor and the contact}, are important in stability and performance.

The composition of the photoconductive layer—for example the presence of surface trap states on the semiconductor materials making up the photoconductor—is an important determinant of device performance and stability. In particular, photoconductive materials are often sensitive to the presence of physisorbed or chemisorbed species, possibly originally presented as a gas (such as O2, H2O, CO2), on the nanoparticle surfaces—these must thus be carefully controlled during processing, and an encapsulating and/or passivating layer(s) can be used, above and/or below, the photoconductive layer, to preserve consistent photoconductive features over time. Further description follows of the interface between metal and semiconductor of an embodiment as well as encapsulation of an embodiment.

The layer '4' can be made from silicon, including single-crystal silicon, polycrystalline silicon, nanocrystalline silicon, or amorphous silicon including hydrogenated amorphous silicon.

The layer '4' can include materials that are not substantially quantum-confined, but instead substantially retain the bandgap of a bulk semiconductor. Embodiments include crystalline or polycrystalline or nanocrystalline or amorphous embodiments of materials such as silicon, gallium arsenide, carbon, PbS, PbSe, PbTe, Bi2S3, In2S3, Copper-Indium-Gallium-Selenide (or Sulfide), SnS, SnSe, SnTe, in which the characteristic size of any crystalline or partially-crystalline subunits is typically not smaller than the Bohr exciton radius (the characteristic spatial extent of electron-hold pairs) in the semiconductor material employed.

The interface formation of an embodiment can comprise the cleaning and termination of material '1'.

The interface of an embodiment can comprise an oxide formed on material '1', including a native oxide as a part of material '2'. The thickness of this oxide is an important determinant of device performance. Excessive oxide thicknesses (e.g., thickness exceeding 10-20 nm) can provide an excessive contact resistance in series with the photoconductive film, necessitating the application of an undesirably increased bias c/o the biasing circuit. In embodiments, the thickness of this native oxide is kept in the range of less than 5 nm.

The interface of an embodiment can comprise a further thin layer as part of material '2', such as TiO2, generally included to modify the work function of the interface with the semiconductor to be placed on top. This layer can, in embodiments, provide selectivity in favor of one type of charge carrier: for example, TiO2 can be configured such that, at the operating bias, it efficiently injects electrons into the conduction band of the photoconductive semiconducting layer; but, at this same bias, it withdraws holes from the valence band of the photoconductive semiconducting layer with much lower effectiveness. TiO2 can be configured such that, at the operating bias, it efficiently extracts electrons from the conduction band of the photoconductive semiconducting layer; but, at this same bias, it injects holes into the valence band of the photoconductive semiconducting layer with much lower effectiveness.

The interface of an embodiment can comprise a further thin layer as part of material '2', such as MEH-PPV, generally included to enable the flow of one type of charge carriers, such as holes, while blocking the flow of the other type, such as electrons.

The interface of an embodiment can comprise a thin layer as part of material '3', possibly a self-organized molecular monolayer, designed to anchor on one side of the molecules to the underlying layers, and at the other terminus of the molecule to anchor to the semiconductor to be placed atop, with the goal of ensuring controlled electronic communication, and also ensuring mechanical stability, e.g., good adhesion between the materials making up the multilayer device.

The layered structure of an embodiment provides efficient charge carrier transfer through an interface. In embodiments, the layered structure can form a substantially ohmic contact with the photoconductive semiconductor layer, providing for little or no depletion of the semiconductor near the interface, and providing for efficient injection and extraction of at least one type (e.g. electrons, holes) of charge carrier. In embodiments, the layered structure can form a Schottky contact with the photoconductive semiconductor layer, providing an energetic barrier that must be overcome for charge carriers to be injected and/or withdrawn. In embodiments, the layered structure can form a selective contact, providing considerably more efficient injection of one type of charge carrier (e.g. electrons) than it provides extraction of the other type (e.g. holes); and/or providing considerably more efficient withdrawal of one type of charge carrier (e.g. electrons) than it provides injection of the other type (e.g. holes).

The layered structure of an embodiment provides a work function of the contact surface where the effective work function is determined by the material of the electrode, material of the interfacial layer, and its thickness.

The layered structure of an embodiment provides blocking capability to suppress the undesirable carrier transfer, for example as a layer proving electron trap states on the surface of metal electrode in case of p-semiconductor photodetector device.

The layered structure of an embodiment provides strong bonding of the photosensitive semiconductor material to the metal electrode.

The layered structure of an embodiment provides high temperature stability of the metal electrode-semiconductor material interface.

The structure and composition of electronic devices of an embodiment with an engineered interfacial layer includes but is not limited to a metal electrode comprising a conventional material used in semiconductor manufacturing being either readily oxidized, or nitridized, or both in a chosen stoichiometric combination, such as Ti, W, Ta, Hf, Al, Cu, Cr, Ag; or being resistive to oxidation or nitridization such as Au, Pt, Rh, Ir, Ru, graphite, amorpohous carbon, graphene, or carbon nanotubes. These metal electrodes can also be formed from alloys, conductive glasses, and various conductive intermetallics. The work function of the resultant electrodes can be tuned through exposure to oxygen, nitrogen, or a combination thereof at a specific temperature for a specific time.

The structure and composition of electronic devices of an embodiment includes an interfacial layer on the surface of the metal contact. The interfacial layer of an embodiment includes an oxide or intermetallic of the element of the electrode with the maximum thickness sufficient to keep the ohmic characteristics of the contact but with the minimum thickness sufficient to create electron trap states. The structure can be created or generated using PVD (physical vapor deposition), ALD (atomic layer deposition), CVD (chemical vapor deposition), ion cluster, ion beam deposition, ion implantation, anneal or other this film deposition method. Additionally, such films can be formed from aqueous and non-aqueous liquid formulations, which can include electrochemical techniques, to form hydroxides, oxides, fluorides, sulfides, sulfates, sulfites, sulphonates, phosphates, phosphonates, phosphides, nitrates, nitrites, nitrides, carbonates, carbides, and other types of salts or complexes of the said metals. The average thickness of the interfacial layer can vary from a 0.1 nm-0.2 nm to 10 nm-50 nm depending on conductivity of the final interfacial layer, and work function of the metal electrode itself.

The interfacial layer of an embodiment includes another oxide deposited on the surface of the electrode, said oxide been doped TiO2, HfO2, Al2O3, SiO2, Ta2O5, $Zn_xAl_yO$, $Zn_xGa_yO$, $ZnIn_xSn_yO$, and similar p-conductive materials. Again, these materials can be deposited using the methods mentioned earlier.

Additional properties of the interfacial layer are determined by the necessity to form relatively strong chemical bond, preferably covalent, to the components of the semiconductor photosensitive layer. In case none of the components of the photosensitive layer provide chemical bonding to the interfacial layer the surface of the interfacial layer is modified using organic by-functional molecules, where one type of functional group provides selective bonding to the interfacial layer surface, while the second type of functional groups provides bonding to either ligand or directly to semiconductor nanocrystals. These bonding molecules can be formed on non-conductive alkane or aryl backbone or can be formed on conductive backbone including aniline, acetylene, or other types of sp2 hybridized carbon. The functional groups to provide bonding to the oxidized surface of the electrode or surface of the interfacial layer include but are not limited to silanes, siloxanes, silizanes, primary, secondary, or tertiary amines, imides, phosphates, oximes, carboxylates. The average length of the organic molecule forming the interfacial layer can typically vary from 2 to 16 carbon atoms.

If the metal of the electrode is passive (e.g., Au, Pt, Cu, Ag, etc.) the interfacial layer can be formed from a molecule including two similar functional groups providing bonding directly to the metal surface on one side and to a nanocrystal on another side. An example would be formation of Au—S—R—S—NC bond. Again, thickness and conductivity of the organic interfacial layer defined by the required electronic device properties.

If the conductivity of the interfacial layer is exceeding the allowable limits required be the electronic device parameters (for planar electrode element) the continuous film can be patterned using conventional patterning techniques.

In each electronic device with at least two electrodes one of the electrodes can be made of a metal with one work function while another electrode can made having a different work function and/or type of conductivity (electron or hole).

For a vertical configuration of electronic device the same approach as above is used for the bottom electrode while the interfacial layer on top is formed by deposition of organic molecules or a thin transparent layer of the semiconductor material.

Molecules described above are polymers with the degree of polymerization from approximately 1 through approximately 10,000.

In forming a device described herein, generally, the device can be formed to include a consistent, reliable combination of material '1' and material '2' which can be followed by the controlled formation or material '3' and the optically-absorbing layer '4'. For example, an embodiment can provide through material '1' a highly conductive contact having resistivity less than 100 microohm*cm and a work function lying between −2 eV and −4.5 V and lying between −2 eV and −4.2 eV. An embodiment can provide through material '2' a large-bandgap layer that permits the injection of electrons into the ensuing photosensitive semiconductor layer, but blocks the extraction of holes from this layer. An embodiment can achieve a controlled thickness of a doped substantially transparent oxide, such as n-type TiOx, as part of the first part of material '2'. For example, an embodiment can achieve a TiOx thickness in the range 2-20 which is controlled to within 1-5 nm; and where the TiOx has a specifically-chosen carrier density of $1\times10^{18}$ cm-3 with a tight band of control such as +/−10% in carrier density.

Manufacturing of a stack or configuration of layers of the device described herein can comprise: (1) formation of the metal, such as via the sputtering of titanium in a nitrogen atmosphere, resulting in the formation of TiN; (2) subsequent processing that results in the formation of an interface layer such as a native oxide, such as TiOxNy or TiOx (it can be that this subsequent processing results in range of possible oxide thicknesses and dopings and carrier concentrations); (3) removal of the native oxide layer through an etch such as a sulfuric acid-hydrogen peroxide-deionized water etch, or an ammonium peroxide etch, or a physical etch such as argon sputtering, or a reactive sputter etch such as argon and hydrogen; in an embodiment this etch completely removes the oxide; a modest overetch to ensure complete removal can be implemented; (4) an embodiment deposits a controlled thickness, controlled doping, and controlled-surface-terminated layer of an oxide such as TiOx, TiOxNy, or other interface layer. Methods such as physical vapor deposition (including DC sputtering, RF sputtering, of a TiOx source, a TiN source, or a Ti source, in the presence of O2, N2, or a combination thereof) can be employed to deposit these layers. Methods also include CVD and ALD where a precursor is first deposited on the surface of the wafer, and a reaction proceeds at a controlled temperature. In cases where TiOx is to be formed, precursors can be employed.

Manufacturing of a stack or configuration of layers of the device described herein can comprise: (1) Formation of the metal, such as via the sputtering of titanium in a nitrogen atmosphere, resulting in the formation of TiN; (2) In-situ transitioning to the deposition on top of this metal of an interface layer. These can include TiOx or TiOxNy. This layer can possess a controlled thickness, controlled doping, and controlled-surface-terminated layer of an oxide such as TiOx, TiOxNy, or other interface layer. Methods such as physical vapor deposition (including DC sputtering, RF sputtering, of a TiOx source, a TiN source, or a Ti source, in the presence of O2, N2, or a combination thereof) can be employed to deposit these layers. Methods also include CVD and ALD where a precursor is first deposited on the surface of the wafer, and a reaction proceeds at a controlled temperature. In cases where TiOx is to be formed chemical precursors can be employed.

As described above, an encapsulating and/or passivating layer(s) can be used, above and/or below, the photoconductive layer, to preserve consistent photoconductive features over time. The embodiments described herein ensure a consistent gas environment (or lack of significant presence of a gas) in the photoconductive layer. For example, vacuum, Argon, Nitrogen, Oxygen, Hydrogen, Carbon Dioxide, can be included or excluded, in various proportions and to various degrees. Embodiments can exclude Oxygen, H2O, CO2, and include only either the absence of gas molecules, or nonreactive materials such as Argon and/or Nitrogen. To preserve consistent photoconductive features over time, an encapsulant layer can be included whose purpose is to avoid gas exchange between the photoconductive film and the region exterior to this film. Materials employed in an embodiment for this purpose include but are not limited to: polyxylylene; As2S3 or As2Se3; Si3N4, SiO2, and mixtures thereof i.e. SiOxNy; oxides such as TiO2, HfO2, Al2O3, SiO2, Ta2O5, ZnxAlyO, ZnxGayO, ZnInxSny.

The encapsulant material can be preceded by a passivation layer, potentially in the form of a substantially single molecular monolayer. This first layer can serve to protect the encapsulated structure during the deposition of the encapsulant: for example, a layer of a material such as polyxylylene can first be deposited, using a procedure that does not deleteriously alter the optoelectronic behavior of the photoconductive layer, and providing protection of the photoconductive layer during ensuing encapsulation processes. It can, for example, protect the film from reactions resultant from oxygen and its radicals that are present during certain processes employed in the deposition of oxygen-containing encapsulants such as SiOx, SiOxNy, etc.

In embodiments, typical thicknesses of the total encapsulant stack (which can comprise multiple layers) can range from a single monolayer (typically ~nm or slightly sub-nm e.g. 5 A) to typically 1 micrometer. In embodiments, typical thicknesses of the total encapsulant stack can be desired to be less than 1-2 micrometers in order to perturb minimally the optical properties of the array.

In embodiments, included in at least one of the layers '1' '2' '3' '4' '5' can be materials that serve to getter molecules that could react with materials in the device, including materials which, if reacted, could alter the photoelectrical properties of the device. Examples of reactive molecules that could enter the device include O2 and H2O and O3. Examples of materials in the device that could have their photoelectrical properties altered by such reactions include material '4' NC, material '3' adhesion, material '2' interface, and '1' metal. Examples of gettering moieties include borazons, borohydrides including tetrahydroborates, catecholborane, L-selectride, lithium borohydride, lithium triethylborohydride, sodium borohydride, and uranium borohydride. Examples of gettering moieties include hydrolysable siloxanes.

The devices of an embodiment can include a strong chemical bond (e.g., covalent), to the components of the semiconductor photosensitive layer. In case none of the components of the photosensitive layer provide chemical bonding to the interfacial layer the surface of the interfacial layer is modified using organic by-functional molecules, where one type of functional group provides selective bonding to the interfacial layer surface, while the second type of functional group provides bonding to either ligand or directly to semiconductor nanocrystals. These bonding molecules can be formed on non-conductive alkane or aryl backbone or can be formed on conductive backbone including aniline, acetylene, or other types of sp2 hybridized carbon. The functional groups to provide bonding to the oxide can include silanes, siloxanes, silizanes, primary, secondary, or tertiary amines, imides, phosphates, oximes, carboxylates.

Manufacturing processes of the devices of an embodiment can include a wafer pre-clean using SC1 of 30 second duration and at 20° C. in a clean dry air ambient. Manufacturing processes of the devices of an embodiment can include a rinse in deionized water of 30 second duration at 20° C. in a clean dry air ambient. Manufacturing processes of the devices of an embodiment can include drying the wafer involving a bake for a prescribed period of time (such as 30 seconds-24 hours) at a prescribed temperature (such as 20, 70, 150, or 200 degrees C.) in a prescribed environment (such as clean dry air, vacuum, nitrogen, argon, or a reducing atmosphere such as hydrogen, or a controlled oxidizing atmosphere containing an inert gas such as N2 or Ar and an oxidizing gas such as O2).

Manufacturing processes of the devices of an embodiment can include the stipulation of maximum and minimum and average queue times in between other processes.

Manufacturing processes of the devices of an embodiment can include treatments of substrates and quantum dot films including exposure to ethanedithiol in acetonitrile at a prescribed temperature, such as 25 degrees C., for a prescribed time, such as 20 seconds, in a prescribed atmosphere, such as N2. Manufacturing processes of the devices of an embodiment can include treatments of substrates and quantum dot films including exposure to hexanedithiol in acetonitrile at a prescribed temperature, such as 25 degrees C., for a prescribed time, such as 20 seconds, in a prescribed atmosphere, such as N2.

Manufacturing processes of the devices of an embodiment can include the deposition of a dielectric capping layer, such as SiO2, at or beneath a certain temperature, such as 100° C., and to a specified thickness of dielectric capping layer such as 100 degrees C.

Manufacturing processes of the devices of an embodiment can include lithographic definition of areas to be etched, followed by etching of materials, including SiO2.

Manufacturing processes of the devices of an embodiment can include the deposition of a dielectric capping layer, such as SiN, at or beneath a certain temperature, such as 100 degrees C., and to a specified thickness of dielectric capping layer such as 100 degrees C.

Manufacturing processes of the devices of an embodiment can include lithographic definition of areas to be etched, followed by etching of materials, including SiN.

Manufacturing processes of the devices of an embodiment can include silicon CMOS manufacturing including processing on 200 mm Si wafers and a standard Al/SiO2 material technology at 0.11 micron nodes prior to deposition of the quantum dot layer. The CMOS manufacturing flow can be completed with a patterned metal contact such as TiN.

Manufacturing processes of the devices of an embodiment can include integration of one Cu/TEOS/SiN HM single damascene layer on top of a via layer followed by selective electroless deposition of Ni/Au stack.

Manufacturing processes of the devices of an embodiment can include substrate pre-treatment. Metal electrode and/or dielectric surface modification might be required to improve electrical contact or adhesion between the layers. Instead of wet preclean the wafer might be treated by plasma or by a liquid-phase or vapor-phase process to form adhesion mono layers with controlled barrier height and density of surface states.

Manufacturing processes of the devices of an embodiment can include the deposition of photosensitive films in which tight control over the ambient atmosphere is provided to minimize and/or control the impact of oxygen and moisture on film performance. They can include the use of production tools equipped with O2 and H2O process monitors. Standard operating procedures can be provided that ensure minimal, or controlled and consistent, exposure of materials (such as quantum dots and layers thereof) to air, including during chemical storage, and transfer of fluids from storage containers to process tool tanks. Manufacturing processes can be compatible with chloroform and other solvents.

Manufacturing processes of the devices of an embodiment can include stabilizing the layer of quantum dots. These can include chemical post-treatment using diluted solutions of dithiols in acetonitrile.

Due to high sensitivity of QF to oxygen and moisture in ambient the queue time between QF deposition and post-treatments should be minimized and be done under N2 blanket. The same conditions apply to the queue time between post-treatment B and dielectric cap deposition.

Manufacturing processes of the devices of an embodiment can include the sealing of the QF film from oxygen and moisture diffusion during the lifetime of the device. Low-temperature deposition of SiO2/SiN stack can be employed. Such processes should be performed at a substrate temperature below 100 degrees C. and at atmospheric pressure or at as high pressure as possible. Other process options can include low-temperature spin-on glass processes or ultra-thin metallic films which will not affect optical transmittance of the capping layers.

Process controls of the devices of an embodiment can include incoming wafer inspection prior to quantum dot film deposition. Inspection steps of an embodiment include: a) inspection for defect density, such as using bright field inspection; b) metal electrode work function inspection, such as using Ultraviolet Photoelectron Spectroscopy (UPS) (the UPS method process control procedure can be performed on blanket process monitor wafers); c) leakage current and dielectric voltage breakdown to be performed on TLM (test pixel array) structures. The photoelectric response of devices and film properties can be employed as part of a process control.

In embodiments, material '4' can include a material having a bandgap, and providing for the absorption of light within a range of wavelengths of interest. In embodiments the photosensitive layer can include materials such as Si, PbS, PbSe, CdS, CdSe, GaAs, InP, InAs, PbTe, CdTe, Ge, In2S3, Bi2S3, and combinations thereof. In embodiments the photosensitive layer can include strongly light-absorbing materials such as porphyrins. In embodiments, the photosensitive layer can include passivating organic ligands such as ethanethiol, ethanedithiol, benzenethiol, benzenedithiol, dibenzenedithiol, pyridine, butylamine.

In embodiments, the photodetectors of an embodiment include photosensitive devices that employ a light-sensitive energetic barrier controlling the flow of at least one type of charge carrier.

In embodiments, the photodetectors can exhibit gain, wherein the ratio of the number of additional units of charge flowing each second to the number of photons impinging on a device each second can exceed unity, for example values lying in the approximately range 2-60.

In embodiments, the photodetectors can exhibit a high normalized response, that is to say, a high ratio of photocurrent to dark current even at low light levels. For example, when 150 nW/cm2 of visible light impinge on the photodetectors, the ratio of photocurrent to light current can exceed 20. In general this value should be as high as possible (while fulfilling other specifications, such as on lag and dark current uniformity and photoresponse uniformity). Values as high as 100 and greater are possible for the normalized response at 150 nW/cm2.

In embodiments, the photodetectors can exhibit a rapid temporal response, with the photo current (including following intense illumination, such as 1 uW/cm2 on pixel and greater) settling to a value close to the dark current (such as one least-significant-bit from the dark current) within less than 1 second. Ideally the photocurrent settles to this value within one exposure period, which can be ⅕ s, ¹⁄₃₀ s, ¹⁄₂₀₀ s, ¹⁄₁₀₀₀ s, or similar.

In embodiments, the current-voltage characteristic in the dark can exhibit, between zero and a first voltage, known as the saturation voltage, a monotonically increasing functional relationship. This range can be referred to as the turn-on phase. The current-voltage can exhibit, between the first voltage and a second, larger, voltage, known as the reach-through voltage, a monotonically increasing relationship having a lower average slope than during the zero-to-first-voltage range. This first-to-second-voltage range can be referred to as the saturation range. At voltages greater than the second, or reach-through, voltage, the current-voltage relationship can exhibit an increase in slope relative to the first-voltage-to-second-voltage range. This highest-voltage range can be termed the post-reach-through range.

In embodiments, gain can be achieved when, under bias, the time for the flowing charge carrier (for example, electrons) to transit the device (i.e., the time to travel between two contacts, such as between left side-material '1' and right side-material '1' in FIG. 2, or the time to travel between material '1' and material '9' in FIG. 3) exceeds the average lifetime of that charge carrier, when the contact that injects the flowing charge carrier (for example, electrons) also prevents the extraction of the other type of charge carrier, which can be termed the blocked carrier (for example, holes), and when the interface between the contact that provides the flowing charge carrier (for example electrons) and the semiconductor film provides a low surface recombination velocity for the blocked carrier (e.g. holes). This interface can be embodied in material '2' and material '3' in FIG. 1, material '2' and material '3' in FIG. 2 and also material '7' and material '3' in FIG. 2, and material '2', material '3', material '5' and material '8' in FIG. 3.

More particularly, gain can be achieved when, under bias, the time for the flowing charge carrier (for example, electrons) to transit the device exceeds the average lifetime of that charge carrier. Quantitatively, it can be said that the base transport factor, alpha_t, is less than but close to unity. This can be achieved if the minority carrier diffusion length for the flowing carrier exceeds the separation between the interface layers.

Furthermore, gain can be achieved when, under bias, the contact that injects the flowing charge carrier (for example, electrons) also prevents the extraction of the other type of charge carrier, which can be termed the blocked carrier (for example, holes). Quantitatively, it can be said that the emitter injection efficiency, gamma, is less than but close to unity. This can be achieved by using an interface layer near the flowing-carrier-injecting contact that blocks the extraction of the other type of charge carrier. This can be achieved by making the interface layer from a large-bandgap material in which one band (such as the conduction band) is substantially closely aligned in energy with the work function of the metal contact with which it is proximate; and which is substantially misaligned in energy with the band in the semiconductor from which it is to block the extraction of charge carriers.

Moreover, gain can be achieved when, under bias, the interface between the contact that provides the flowing charge carrier (for example electrons) and the semiconductor film provides a low surface recombination velocity for the blocked carrier (e.g. holes). Quantitatively, it can be said that the recombination factor is less than, but close to, unity. This can be achieved if, within the minority carrier lifetime of the flowing carrier (e.g. electrons), only a small fraction of the blocked-carrier (e.g. holes) recombine near the interface between the contact that provides the flowing charge carrier (for example electrons) and the semiconductor film. This can require that the surface recombination velocity for the blocked carrier be less than 0.1 cm/s, for example 0.01 cm/s or less.

Referring to FIG. 2, embodiments can include methods and structures taken to reduce the dark current passing between leftmost material '1' and rightmost material '1'. Embodiments can include the removal of conductive moieties in the portion of material '3' that reside between the contacts leftmost material '1' and rightmost material '1.' Embodiments can include the removal of conductive moieties such as metal oxides, metal hydroxides, organic contamination, polymer, conductive oxides that reside between the contacts leftmost material '1' and rightmost material '1'. Referring to FIG. 2, embodiments can include the modification of the interface between material '7' and material '4' in order to control the recombination rate, the trapped charge, the adhesion, or a plurality of such properties at this interface.

Referring to FIG. 1, embodiments include controlling surface states such as those present in interface layers '2' and '3.' Embodiments include striking a metal such as TiN in material '1' or a metal hydroxide such as TiOx in material '2' with xenon or other species or employing argon sputtering in order to control or modify the recombination rate on the surface. Embodiments can include reducing the surface recombination velocity for charge carriers of one type to less than 0.1 cm/s or to less than 0.01 cm/2 at this interface.

Embodiments include the realization of small pixels with a pixel pitch of 0.9 um in each lateral dimension. Embodiments include the use of narrow vias such as 0.15 um. Embodiments include the use of metal-to-metal spacings of 0.14 um.

Embodiments described herein include an optically sensitive device comprising: a first contact and a second contact, each having a work function; an optically sensitive material between the first contact and the second contact, the optically sensitive material comprising a p-type semiconductor, and the optically sensitive material having a work function; circuitry configured to apply a bias voltage between the first contact and the second contact; the magnitude of the work function of the optically sensitive material being at least 0.4 eV greater than the magnitude of the work function of the first contact, and also at least 0.4 eV greater than the magnitude of the work function of the second contact; the optically sensitive material having an electron lifetime that is greater than the electron transit time from the first contact to the second contact when the bias is applied between the first contact and the second contact; the first contact providing injection of electrons and blocking the extraction of holes; the interface between the first contact and the optically sensitive material providing a surface recombination velocity less than 1 cm/s.

Embodiments described herein include an optically sensitive device comprising: a first contact; an n-type semiconductor; an optically sensitive material comprising a p-type semiconductor; a second contact; the optically sensitive material and the second contact each having a work function shallower than 4.5 ev; circuitry configured to apply a bias voltage between the first contact and the second contact; the optically sensitive material having an electron lifetime that is greater than the electron transit time from the first contact to the second contact when the bias is applied between the first contact and the second contact; the first contact providing injection of electrons and blocking the extraction of holes; the interface between the first contact and the optically sensitive material providing a surface recombination velocity less than 1 cm/s.

Embodiments described herein include a photodetector comprising: a first contact and a second contact, each having a work function; an optically sensitive material between the first contact and the second contact, the optically sensitive material comprising a p-type semiconductor, and the optically sensitive material having a work function; circuitry configured to apply a bias voltage between the first contact and the second contact; the magnitude of the work function of the optically sensitive material being at least 0.4 eV greater than the magnitude of the work function of the first contact, and also at least 0.4 eV greater than the magnitude of the work function of the second contact; circuitry configured to apply a bias voltage between the first contact and the second contact; and the optically sensitive material configured to provide a responsivity of at least 0.8 A/W when the bias is applied between the first contact and the second contact.

The first contact of the photodetector of an embodiment is an injecting contact and the second contact is a withdrawing contact.

The injecting contact of the photodetector of an embodiment is configured to inject a flowing carrier into the optically sensitive material with greater efficiency than the injecting contact withdraws a trapped carrier from the optically sensitive material.

The injecting contact of the photodetector of an embodiment is configured to withdraw a flowing carrier from the optically sensitive material with greater efficiency than the withdrawing carrier injects a trapped carrier into the optically sensitive material.

The optically sensitive material of the photodetector of an embodiment is a p-type semiconductor material.

The first contact of the photodetector of an embodiment comprises metal and wherein the second contact comprises metal.

The bias of the photodetector of an embodiment is in the range of about −0.1 Volts to −2.8 Volts and the flowing carrier is electrons.

The optically sensitive material of the photodetector of an embodiment comprises nanoparticles selected from the group consisting of PbS, PbSe, PbTe, CdS, CdSe, CdTe, Si, Ge, or C.

Each nanoparticle of the photodetector of an embodiment includes an oxide on the surface of the nanoparticle.

An optically sensitive layer of the photodetector of an embodiment comprises a material selected from the group consisting of PbSO4, PbO, PbSeO4, PbTeO4, SiOxNy, In2O3, sulfur, sulfates, sulfoxides, carbon and carbonates.

The nanoparticles of the photodetector of an embodiment are interconnected.

The injecting contact and the withdrawing contact of the photodetector of an embodiment each comprise a material selected from the group consisting of Al, Ag, In, Mg, Ca, Li, Cu, Ni, NiS, TiN, or TaN.

The optically sensitive layer of the photodetector of an embodiment has a dimension perpendicular to the direction of incident of light in the range of from 100 to 3000 nm.

A first carrier type of the photodetector of an embodiment is in the majority in the dark and a second carrier type is in the majority under illumination.

The first carrier type of the photodetector of an embodiment is holes and the second carrier type is electrons.

The first contact and the second contact of the photodetector of an embodiment comprise a shallow-work function metal.

The first contact and the second contact of the photodetector of an embodiment comprise each have a work function shallower than 4.5 ev.

The distance between the first contact and the second contact of the photodetector of an embodiment is in the range of 200 nm to 2 um.

The flowing carrier of the photodetector of an embodiment has a mobility of at least of at least 1E-5 cm2/Vs.

The p-type semiconductor material of the photodetector of an embodiment is a doped p-type material.

The bias of the photodetector of an embodiment is in the range of about +0.1 Volts to +2.8 Volts and the flowing carrier is holes.

The injecting contact and the withdrawing contact of the photodetector of an embodiment each comprise a material selected from the group consisting of Au, Pt, Pd, Cu, Ni, NiS, TiN and TaN.

A first carrier type of the photodetector of an embodiment is in the majority in the dark and a second carrier type of the photodetector of an embodiment is in the majority under illumination.

The first carrier type of the photodetector of an embodiment is electrons and the second carrier type is holes.

The first contact and the second contact of the photodetector of an embodiment comprise a deep-work function metal.

The first contact and the second contact of the photodetector of an embodiment comprise each have a work function deeper than 4.5 ev.

The n-type semiconductor material of the photodetector of an embodiment is a doped n-type material.

The optically sensitive material of the photodetector of an embodiment has a work function deeper than the work function of the first contact and the second contact by at least 0.3 eV.

The first contact and the second contact of the photodetector of an embodiment each comprise a material selected from the group consisting of Al, Ag, In, Mg, Ca, Li, Cu, Ni, NiS, TiN, TaN, n-type polysilicon and n-type amorphous silicon.

Embodiments described herein include a photodetector comprising: a first contact and a second contact; an optically sensitive material between the first contact and the second contact, the optically sensitive material comprising an n-type semiconductor; the first contact and the second contact each having a work function deeper than 4.5 ev; circuitry configured to apply a bias voltage between the first contact and the second contact; and the optically sensitive material configured to provide a photoconductive gain and a responsivity of at least 0.4 A/W when the bias is applied between the first contact and the second contact.

The optically sensitive material of the photodetector of an embodiment has a work function shallower than the work function of the first contact and the second contact by at least 0.3 eV.

The first contact and the second contact of the photodetector of an embodiment each comprise a material selected from the group consisting of Au, Pt, Pd, Cu, Ni, NiS, TiN, TaN, p-type polysilicon and p-type amorphous silicon.

Embodiments described herein include a phototransistor comprising: a first contact and a second contact; an optically sensitive material between the first contact and the second contact, the optically sensitive material comprising an n-type semiconductor; the first contact and the second contact each having a Schottky contact or work function deeper than 4.5 ev; circuitry configured to apply a bias voltage between the first contact and the second contact; and the optically sensitive material having a hole lifetime that is greater than the hole transit time from the first contact to the second contact when the bias is applied between the first contact and the second contact.

The flowing carrier of the photodetector of an embodiment is holes and the trapped carrier is electrons.

Embodiments described herein include a phototransistor comprising: a first contact and a second contact; an optically sensitive material between the first contact and the second contact, the optically sensitive material comprising a p-type semiconductor; the first contact and the second contact each having a Schottky contact or work function shallower than 4.5 ev; circuitry configured to apply a bias voltage between the first contact and the second contact; and the optically sensitive material having an electron lifetime when the bias is applied between the first contact and the second contact; wherein the electron mobility of the optically sensitive material, the distance between the first contact and the second contact and the bias voltage are selected such that the electron transit time from the first contact to the second contact is less than the electron lifetime when the bias is applied between the first contact and the second contact.

The flowing carrier of the photodetector of an embodiment is electrons and the trapped carrier is holes.

Embodiments described herein include a phototransistor comprising: a first contact and a second contact; an optically sensitive material between the first contact and the second contact, the optically sensitive material comprising an n-type semiconductor; the first contact and the second contact each having a Schottky contact or work function deeper than 4.5 ev; circuitry configured to apply a bias voltage between the first contact and the second contact; the optically sensitive material having a hole lifetime when the bias is applied between the first contact and the second contact; wherein the hole mobility of the optically sensitive material, the distance between the first contact and the second contact and the bias voltage are selected such that the hole transit time from the first contact to the second contact is less than the hole lifetime when the bias is applied between the first contact and the second contact.

The flowing carrier of the photodetector of an embodiment is holes and the trapped carrier is electrons.

The photodetector of an embodiment comprises a p-type semiconductor comprising p-doped silicon.

The photodetector of an embodiment comprises a p-type semiconductor comprising GaAs.

The photodetector of an embodiment comprises a p-type semiconductor comprising quantum dots/nanocrystals.

The photodetector of an embodiment comprises a p-type semiconductor comprising a network of interconnected nanocrystals.

The photodetector of an embodiment comprises a p-type semiconductor comprising nanocrystals and linker molecules.

The photodetector of an embodiment comprises a p-type semiconductor comprising a compound semiconductor.

The photodetector of an embodiment comprises a p-type semiconductor comprising PbS, PbS with $PBSO_3$.

Embodiments described herein include an optically sensitive device comprising: a first contact and a second contact, each having a work function; an optically sensitive material between the first contact and the second contact, the optically sensitive material comprising a p-type semiconductor, and the optically sensitive material having a work function; circuitry configured to apply a bias voltage between the first contact and the second contact; the magnitude of the work function of the optically sensitive material being at least 0.4 eV greater than the magnitude of the work function of the first contact, and also at least 0.4 eV greater than the magnitude of the work function of the second contact; the optically sensitive material having an electron lifetime that is greater than the electron transit time from the first contact to the second contact when the bias is applied between the first contact and the second contact; the first contact providing injection of electrons and blocking the extraction of holes; and the interface between the first contact and the optically sensitive material providing a surface recombination velocity less than 1 cm/s.

The work function of the first contact and the second contact of the device of an embodiment are each shallower than 4.5 ev.

The bias of the device of an embodiment is in the range of about −0.1 Volts to −2.8 Volts.

The optically sensitive material of the device of an embodiment comprises a plurality of nanoparticles, wherein each of the nanoparticles has an oxide on a surface of the respective nanoparticle.

The optically sensitive material of the device of an embodiment comprises nanoparticles selected from the group consisting of PbS, PbSe, PbTe, CdS, CdSe, CdTe, Si, Ge, or C.

The optically sensitive layer of the device of an embodiment comprises a material selected from the group consisting of $PbSO_4$, PbO, $PbSeO_4$, $PbTeO_4$, $SiO_xN_y$, $In_2O_3$, sulfur, sulfates, sulfoxides, carbon and carbonates.

The optically sensitive material of the device of an embodiment comprises a plurality of interconnected nanoparticles.

The first contact and the second contact of the device of an embodiment each comprise a material selected from the group consisting of Al, Ag, In, Mg, Ca, Li, Cu, Ni, NiS, TiN, or TaN, $TiO_2$, $Ti_xN_y$, ITO, Ru, TiSi, $WSi_2$, $TiO_x$ doped with B, $TiO_x$ doped with C, $TiO_x$ doped with Co, $TiO_x$ doped with Fe, $TiO_x$ doped with Nd, $TiO_x$ doped with N.

The first contact and the second contact of the device of an embodiment are separated by a distance in the range of 200 nm to 2 um and the electron mobility in the optically sensitive material is at least 1E-5 $cm^2$/Vs.

The optically sensitive material of the device of an embodiment is configured to provide a responsivity of at least 0.8 A/W when the bias is applied between the first contact and the second contact.

Embodiments described herein include an optically sensitive device comprising: a first contact; an n-type semiconductor; an optically sensitive material comprising a p-type semiconductor; a second contact; the magnitude of the work function of the optically sensitive material being at least 0.4 eV greater than the magnitude of the work function of the second contact; the optically sensitive material having an electron lifetime that is greater than the electron transit time from the first contact to the second contact when the bias is applied between the first contact and the second contact; the n-type semiconductor providing injection of electrons and blocking the extraction of holes; and the interface between the n-type semiconductor and the optically sensitive material providing a surface recombination velocity less than 1 cm/s.

The n-type semiconductor of the device of an embodiment comprises a material selected from the group consisting of $TiO_2$, $TiO_2$ that has been chemically reduced, $TiO_2$ that has been oxidized, CdTe, CdS, CdSe, Si, or nanoparticles selected from the group consisting of PbS, PbSe, PbTe, CdS, CdSe, CdTe, Si, Ge, or C.

The bias of the device of an embodiment is in the range of about −0.1 Volts to −2.8 Volts.

The optically sensitive material of the device of an embodiment comprises a plurality of nanoparticles, wherein each of the nanoparticles has an oxide on a surface of the respective nanoparticle.

The optically sensitive material of the device of an embodiment comprises nanoparticles selected from the group consisting of PbS, PbSe, PbTe, CdS, CdSe, CdTe, Si, Ge, or C.

The optically sensitive material of the device of an embodiment comprises a plurality of interconnected nanoparticles.

The first contact and the second contact of the device of an embodiment are separated by a distance in the range of 200 nm to 2 um.

The first contact and the second contact of the device of an embodiment each comprise a material selected from the group consisting of Al, Ag, In, Mg, Ca, Li, Cu, Ni, NiS, TiN, TaN, $TiO_2$, $Ti_xN_y$, ITO, Ru, TiSi, $WSi_2$, $TiO_x$ doped with B, $TiO_x$ doped with C, $TiO_x$ doped with Co, $TiO_x$ doped with Fe, $TiO_x$ doped with Nd, $TiO_x$ doped with N.

Embodiments described herein include a photodetector comprising: a first contact and a second contact, each having a work function; an optically sensitive material between the first contact and the second contact, the optically sensitive material comprising a p-type semiconductor, and the optically sensitive material having a work function; circuitry configured to apply a bias voltage between the first contact and the second contact; the magnitude of the work function of the optically sensitive material being at least 0.4 eV greater than the magnitude of the work function of the first contact, and also at least 0.4 eV greater than the magnitude of the work function of the second contact; circuitry configured to apply a bias voltage between the first contact and the second contact; and the optically sensitive material configured to provide a responsivity of at least 0.8 A/W when the bias is applied between the first contact and the second contact.

The work function of the first contact and the second contact of the photodetector of an embodiment are each shallower than 4.5 eV.

The bias of the photodetector of an embodiment is in the range of about −0.1 Volts to −2.8 Volts.

The optically sensitive material of the photodetector of an embodiment comprises nanoparticles selected from the group consisting of PbS, PbSe, PbTe, CdS, CdSe, CdTe, Si, Ge, or C.

The optically sensitive layer of the photodetector of an embodiment comprises a material selected from the group consisting of PbSO4, PbO, PbSeO4, PbTeO4, SiOxNy, In2O3, sulfur, sulfates, sulfoxides, carbon and carbonates.

The first contact and the second contact of the photodetector of an embodiment each comprise a material selected from the group consisting of Al, Ag, In, Mg, Ca, Li, Cu, Ni, NiS, TiN, TaN, TiO2, TixNy, ITO, Ru, TiSi, WSi2, TiOx doped with B, TiOx doped with C, TiOx doped with Co, TiOx doped with Fe, TiOx doped with Nd, TiOx doped with N.

The first contact and the second contact of the photodetector of an embodiment are separated by a distance in the range of 200 nm to 2 um and the electron mobility in the optically sensitive material is at least 1E-5 cm2/Vs.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import, when used in this application, refer to this application as a whole and not to any particular portions of this application. When the word "or" is used in reference to a list of two or more items, that word covers all of the following interpretations of the word: any of the items in the list, all of the items in the list and any combination of the items in the list.

The above description of embodiments is not intended to be exhaustive or to limit the systems and methods to the precise forms disclosed. While specific embodiments of, and examples for, the embodiments are described herein for illustrative purposes, various equivalent modifications are possible within the scope of the systems and methods, as those skilled in the relevant art will recognize. The teachings of the embodiments provided herein can be applied to other systems and methods, not only for the systems and methods described above.

The elements and acts of the various embodiments described above can be combined to provide further embodiments. These and other changes can be made to the embodiments in light of the above detailed description.

What is claimed is:

1. An optically sensitive device comprising:
an optically sensitive material;
a first contact, comprising titanium nitride (TiN), which is coupled to a first side of the optically sensitive material by an oxide interface layer selected from a group consisting of TiO2, TiOx, and TiOxNy, wherein the oxide interface layer comprises a doped n-type material; and
a second contact, comprising a transparent conductive material coupled to a second side of the optically sensitive material.

2. The device according to claim 1, wherein the oxide interface layer has a thickness between 2 and 20 nm.

3. The device according to claim 1, wherein the oxide interface layer comprises TiOx, wherein x is less than 2.

4. The device according to claim 3, wherein x=1.9.

5. The device according to claim 1, wherein the oxide interface layer comprises TiOx, wherein x is greater than 2.

6. The device according to claim 5, wherein x=2.1.

7. The device according to claim 1, wherein the oxide interface layer is formed by exposing the TiN of the first contact to an oxidizing species.

8. The device according to claim 1, wherein the oxide interface layer is formed by exposing the TiN of the first contact to an elevated temperature.

9. The device according to claim 1, where a portion of the oxide interface layer has a bandgap that is larger than about 2 eV.

10. The device according to claim 1, wherein the optically sensitive material has a first work function having a magnitude at least 0.4 eV greater than a second work function of the second contact.

11. The device according to claim 1, wherein the optically sensitive material has an electron lifetime that is greater than an electron transit time from the first contact to the second contact when a bias is applied between the first contact and the second contact.

12. The device according to claim 1, wherein the optically sensitive material comprises nanoparticles.

13. The device according to claim 12, wherein the nanoparticles are selected from a group consisting of PbS, PbSe, PbTe, CdS, CdSe, CdTe, Si, Ge, and C.

14. The device according to claim 12, wherein the nanoparticles comprise quantum dots.

15. The device according to claim 1, wherein the optically sensitive material comprises a cross-linking agent.

* * * * *